(12) United States Patent
Schaff et al.

(10) Patent No.: US 6,953,740 B2
(45) Date of Patent: Oct. 11, 2005

(54) HIGHLY DOPED III-NITRIDE SEMICONDUCTORS

(75) Inventors: William J. Schaff, Ithaca, NY (US); Jeonghyun Hwang, Ithaca, NY (US)

(73) Assignee: Cornell Research Foundation, Inc., Ithaca, NY (US)

(*) Notice: Subject to any disclaimer, the term of this patent is extended or adjusted under 35 U.S.C. 154(b) by 0 days.

(21) Appl. No.: 10/146,466

(22) Filed: May 15, 2002

(65) Prior Publication Data

US 2003/0176003 A1 Sep. 18, 2003

Related U.S. Application Data

(63) Continuation-in-part of application No. 10/140,774, filed on May 7, 2002, now Pat. No. 6,888,170.
(60) Provisional application No. 60/364,499, filed on Mar. 15, 2002.

(51) Int. Cl.[7] .............................................. H01L 21/20
(52) U.S. Cl. ....................................................... 438/508
(58) Field of Search .................................. 438/478, 479, 438/481, 487, 495, 507, 508, 604; 257/76, 189; 117/108

(56) References Cited

U.S. PATENT DOCUMENTS

| | | | |
|---|---|---|---|
| 110,945 A | 1/1871 | Woodward | 438/36 |
| 4,821,093 A | 4/1989 | Iafrate et al. | 357/22 |
| 5,013,685 A | 5/1991 | Chiu et al. | 437/184 |
| RE33,671 E | 8/1991 | Dingle et al. | 437/107 |
| 5,194,400 A | 3/1993 | Takamori et al. | 437/129 |
| 5,548,127 A | 8/1996 | Shakuda | 257/13 |
| 5,602,418 A | 2/1997 | Imai et al. | 257/627 |
| 5,710,058 A | 1/1998 | Schneier et al. | 437/107 |
| 5,847,397 A * | 12/1998 | Moustakas | 250/370.06 |
| 6,013,129 A | 1/2000 | Yoshida | 117/19 |
| 6,046,464 A | 4/2000 | Schetzina | 257/96 |
| 6,156,581 A | 12/2000 | Vaudo et al. | 438/22 |
| 6,206,969 B1 | 3/2001 | Takahashi et al. | 118/715 |
| 6,252,287 B1 | 6/2001 | Kurtz et al. | 257/461 |
| 6,323,073 B1 | 11/2001 | Yeh et al. | 438/181 |
| 6,361,618 B1 * | 3/2002 | Nulman | 134/21 |
| 6,373,188 B1 | 4/2002 | Johnson et al. | 313/506 |
| 6,677,619 B1 * | 1/2004 | Nagahama et al. | 257/94 |
| 2001/0030317 A1 | 10/2001 | Lee et al. | 257/13 |
| 2002/0096675 A1 * | 7/2002 | Cho et al. | 257/25 |

OTHER PUBLICATIONS

Sinharoy et al. "Molecular beam epitaxy growth and characterization of GaN and AlxGa1–xN on 6 H–SiC", J. Vac. Sci Technol. A, vol. 14(3), May/Jun 1996, pp 896–899.*

Taga et al., "Electrical properties and surface morphology of heteroepitaxial–grown tin–doped indium oxide thin films deposited by molecular–beam epitaxy," J. Vac. Sci. Technol. A, vol 18(4), Jul/Aug 2000, pp1663–1667.*

Gmachi et al., "Intersubband absorption in degenerately doped GaN/AlxGa1–xN coupled double quantam wells," Applied Physics Letters, vol 79 (11), Sep. 10, 2001, pp 1590–1592.*

Iliopoulos et al. "Broadening of near–band–gap photoluminescence in n–Gan films." Applied Physics Letters, vol 73(3), Jul. 20, 1998, pp 375–377.*

(Continued)

Primary Examiner—Erik Kielin
Assistant Examiner—Jennifer M Dolan
(74) Attorney, Agent, or Firm—Schwegman, Lundberg, Woessner & Kluth, P.A.

(57) ABSTRACT

A wide bandgap semiconductor material is heavily doped to a degenerate level. Impurity densities approaching 1% of the volume of the semiconductor crystal are obtained to greatly increase conductivity. In one embodiment, a layer of AlGaN is formed on a wafer by first removing contaminants from a MBE machine. Wafers are then outgassed in the machine at very low pressures. A nitride is then formed on the wafer and an AlN layer is grown. The highly doped GaAlN layer is then formed having electron densities beyond $1 \times 10^{20}$ cm$^{-3}$ at Al mole fractions up to 65% are obtained.

10 Claims, 6 Drawing Sheets

OTHER PUBLICATIONS

Kasic et al. "Optical phonon modes and interband transitions in cubic AlxGa1–xN films," *Physical Review B*, volumn 65, Rec. Oct. 8, 2001, Publ Apr. 23, 2002, pp. 184302–1–13.*

"Essentials of the Free Electron Gas", Semiconductor Physics, http://www.techfak.uni-kiel.de/matwis/amat/semi_en/kap_2/backbone/r2_1_1.html, (2002), 6 pages.

Burm, J., et al., "Ultra Low Resistive Ohmic Contacts on n–GaN using Si implatation", *Appl. Phys. Letter*, 70(4), (1997), 464–466.

Eastman, L., et al., "Results, Potential and Challenges of High Power GaN–Based Transistors", *Phys. Stat. Col., 176*, (1999), 175–178.

Goepfert, I., et al., "Experimental and theoretical study of acceptor activation and transport properties in p–type AlxGa1–xGaN superlattices", *JAP, 88*, (2000), 2030–2036.

Hamdani, F., et al., "Optical properties of GaN grown on ZnO by reactive molecular beam epitaxy", *Applied Physics Letters, 70 (4)*, (Jan. 1997), 467–469.

Hwang, Jeonghyun, et al., "Si doping of high–Al–mole fraction AlxGa1–XN alloys with rf plasma–induced molecular–beam–epitaxy", *Applied Physics Letters, 81 (27)*, (Dec. 30, 2002), 5192–5194.

Jenny, J., et al., "Growth kinetics of GaN grown by gassource molecular beam epitaxy", *J. Crystal Growth, 175*, (1997), 89–93.

Jeon, et al., "Lateral current spreading in GaN–based light-emitting diodes utilizing tunnel contact junctions", *Applied Physics Letters, 78*, (2001), 3265–3267.

Kickuchi, A., et al., "Improvement of electrical property and surface morphology of GaN grown by RF–plasma assisted molecular beam epitaxy by introduction of multiple AlN intermediate layer.", *Materials Science & Engineering B–Solid State Materials for Advanced Technology, B82 (1–3)*, (2001), 12–15.

Li, Y., et al., "Low–resistance ohmic contacts to p–type GaN", *Appl. Phys. Lett., 76*, (2000), 2728–2730.

Lu, H., et al., "Improvement in epitaxial growth of InN by migration enhanced epitaxy", *Applied Physics Letters, 77*, (2000), 2548–2550.

Murphy, M., et al., "High–frequency AlGaN/GaN polarization–induced high–electron mobility transistors grown by plasma–assisted molecular–beam epitaxy", *Applied Physics Letters, 6*, (1999), 3653–3655.

Ozden, I, et al., "A dual–wavelength indium gallium nitride quantum well light emitting diode", *Applied Physics Letters*, (2001), 2532–2534.

Polyakov, A. Y., et al., "Properties of Si Donnors and Persistent Photoconductivity in AlGaN", *Solid–State Electronics, 42 (42)*, (1998), 627–635.

Ridley, B., et al., "Mobility of Electrons in Bulk GaN and Al/sub x/Ga/sub 1–x/N/GaN Heterostructures", *Physical Review B*, (2000), 16862–16869.

Sanchez–Garcia, M., et al., "MBE growth of GaN and AlGaN layers of Si(1 1 1) substrates: doping effects", *Journal of Crystal Growth, 201/202*, (1999), 415–418.

Saxler, A., et al., "Electrical transport of an AlGaN/GaN two–dimensional electron gas", *Materials Research Society Symposium Proceedings, 595*, (2000), 6 pages.

Sekiguchi, T., et al., "Improvement of Current Injection Uniformity and Device Resistance in Long–Wavelength Vertical–Cavity Surface–Emitting Laser using a Tunnel Junction", *Jpn. J. Appl. Phys, 39*, (2000), 3997–4001.

Songprakob, W., et al., "Infrared Studies of Hole–Plasmon Excitations in Heavily–doped p–type MBE–Grown GaAs:C", *Physical Review B, 62*, (2000), 4501–4510.

Takeuchi, T., et al., "GaN–Based Light Emitting Diodes with Tunnel Junctions", *Jpn. J. Appl. Phys., 40*, (2001), L861–L863.

Zhang, X., "Growth of Al/sub x/Ga/sub 1–x/N:Ge on sapphire and silicon substrates", *Applied Physics Letters, 67 (12)*, (Sep. 1995), 1745–1747.

* cited by examiner

HIGHLY DOPED III-NITRIDE SEMICONDUCTORS

RELATED APPLICATIONS

This application is a continuation-in-part of U.S. patent application Ser. No. 10/140,774, filed May 7, 2002, now U.S. Pat. No. 6,888,170, entitled HIGHLY DOPED III-NITRIDE SEMICONDUCTORS, which claims the benefit of priority to U.S. Provisional Patent Application Ser. No. 60/364,499, filed Mar. 15, 2002, the entirety of which is incorporated herein by reference.

GOVERNMENT FUNDING

The invention described herein was made with U.S. Government support under Grant Number 0123453 awarded by the National Science Foundation. The United States Government has certain rights in the invention.

FIELD OF THE INVENTION

The present invention relates to degenerate doping of high mole fraction Nitrides, and in particular to increasing the conductivity of the AlGaN by high density doping for applications including light emitting diodes, lasers, transistors, light detectors, photovoltaic cells and thermocouple.

BACKGROUND OF THE INVENTION

UV emitters are formed using multiple quantum wells combined with electrical contacts to the wells. Such contacts are formed of AlGaN in some UV emitters. The wells emit light when a voltage is applied across the contacts. Difficulties in conventional approaches to UV emitter fabrication for short wavelengths are predominantly based on poor electrical conductivity in high Al mole fraction AlGaN, and high resistance contacts to these materials.

The mole fraction of Al determines the bandgap energy (and wavelength of emission) of AlGaN. High Al mole fractions produce a large bandgap—GaN is 3.4 eV (364 nm) and AlN is 6.2 eV (200 nm). The LED or laser requires higher bandgap materials to surround the emitting materials to avoid self-absorption of light, and for the laser, to provide lower refractive index clad layers. Thus, to get shorter wavelength light, higher Al mole fractions are required, and even higher Al mole fractions need to be electrically conducting for the surrounding clad layers.

SUMMARY OF THE INVENTION

A method forms a highly doped wide bandgap semiconductor materials to a degenerate level. Impurity densities approaching 1% of the volume of the semiconductor crystal are obtained to greatly increase conductivity.

DETAILED DESCRIPTION OF THE INVENTION

In the following description, reference is made to the accompanying drawings, which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the scope of the present invention. Ranges of values have been given for various parameters and expressed as typical, minimum and maximum for various embodiments. These are approximate values and should not be taken as absolutes. Further, potentially large variations in parameter values may occur for alternative embodiments without departing from the invention as claimed. The following description is, therefore, not to be taken in a limited sense, and the scope of the present invention is defined by the appended claims.

Figure 1:
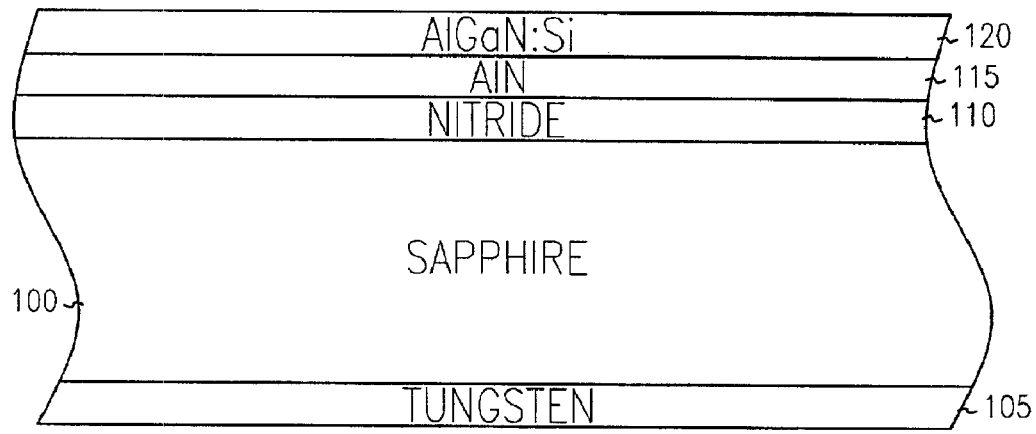
FIG. 1 is a representation of the order of depositing layers to form a highly doped layer of AlGaN.

In FIG. 1 a two-inch diameter sapphire wafer 100, approximately 330 microns thick is polished to yield the (1000) orientation. The backside of the wafer 100 is lapped to a rough surface. Approximately one micron of Tungsten 105 is deposited on the back of the wafer in one embodiment for improved efficiency in heating the wafer during growth. In one embodiment, the wafer is formed of sapphire, but other alternatives include SiC, Si, bulk GaN, AlN or any other substitute.

FIG. 1 is an illustration of one process of forming a highly doped AlGaN layer. While individual layers are described as being formed, such layers combine in further processing.

The wafer 100 is clipped into a wafer holder for loading into a molecular beam epitaxy (MBE) processing machine. The wafer is loaded into a load lock and pumped to approximately $10^{-7}$T. It is then transferred to a transition chamber at $10^{-10}$T where it is outgassed for 1-hour holding time at approximately 400° C. typical, 200° C. minimum, 600° C. maximum to remove atmosphere contamination from the wafer and wafer holder. The temperature is raised and lowered from room temperature to high temperature hold, and back again, over 30 minute periods to avoid wafer shattering due to thermal stresses.

Substrate temperatures below 490° C. are estimated from measurements of a thermocouple located a few mm behind the back of the wafer, which receives radiant heat from the wafer. Higher temperatures are measured with an optical pyrometer aimed at the front surface of the wafer. Sapphire and the deposited nitride semiconductor materials are mostly transparent to the measurement wavelengths used by the pyrometer. The temperature measurements are not precisely the same as the nitride layer. The temperature measurement is most closely related to the temperature of the tungsten, or other metal, coating on the back of the sapphire wafer. The pyrometer temperature measurement is used in this manner as a process control tool.

The wafer is then loaded into a growth chamber at approximately $10^{-10}$T typical, $10^{-11}$T minimum and $10^{-9}$T maximum. The chamber has been previously treated to remove moisture, oxygen and other possible contaminants as described below. The substrate temperature is then raised to approximately 200° C.+/−100° C. after the wafer is brought to the growth position, where it faces furnaces and an RF source, and all source shutters remain closed. Nitrogen is then fed to the RF source at a flow rate of approximately 0.7 sccm typical, 0.5 sccm minimum, and 0.9 sccm maximum. The source power is approximately 500 W typical, 250 W minimum, 600 W maximum.

After the flow has stabilized (approximately 15 minutes typical, 5 minutes minimum, 20 minutes maximum), the shutter of the RF source with a source power of approximately 500 W typical, 250 W minimum, 600W maximum, is opened to nitridize the surface 110 of the sapphire wafer 105. The shutter is closed and the wafer is heated to approximately 1033° C. typical, 900° C. minimum, 1100° C. maximum, as measured by optical pyrometer over 30 minutes. During this time, the RF power is brought to 250 W typical, 200 W minimum, 350 W maximum and flow is reduced to 0.4 sccm typical, 0.2 minimum, 0.7 maximum.

An AlN layer 115 of 100 nm +/−50 nm is grown by opening the Al and RF shutter together for approximately 1 min 50 sec typical, 1-minute minimum, and 3 minutes maximum. Al,Ga and Si temperatures are measured by a thermocouple in contact with the outside of the pyrolytic boron nitride crucible which contains the furnace contents. The temperature readings are all higher than the actual temperature of the furnace contents due to this physical design. Furnace temperature values are used as process control tools and do not measure actual source material temperatures. The Al temperature is approximately 1276° C. typical, 1225° C. min, 1325° C. max).

The Al temperature is then lowered to approximately 1205° C.+/−50° C. while all shutters are closed for approximately 1 minute 10 sec. The RF, Al, Ga and Si shutters are then opened. The Ga temperature is approximately 1167° C.+/−50° C. and Si temperature is adjusted for doping concentration. A Si temperature of approximately 1425° C. gives an electron density of $1 \times 10^{20}$ cm−3 in AlGaN with Al compositions from 47 to 65% in one embodiment. Al temperatures above 1225° C. give about 47% Al mole fraction, while Al temperature of 1225° C. gives about 65% Al mole fraction. The shutters remain open for approximately 1 hr 10 min which results in 400 nm thick layer 120 of AlGaN:Si. The wafer is cooled over 15 minutes after growth.

Figure 2:
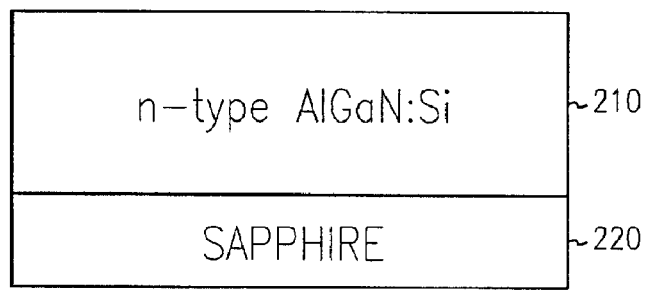
FIG. 2 is a cross section representation of a highly doped n-type AlGaN:Si formed on a substrate.

FIG. 2 is a cross section representation of N-type AlGaN:Si at 210 formed on a sapphire substrate 220 via the process of FIG. 1. Other substrate alternatives comprise SiC, Si, bulk GaN, AlN or other substitutes. The choice of substrate is not likely to influence highly conducting AlGaN characteristics. Doping levels have been obtained consistent with n-GaN beyond $3 \times 10^{20}$ cm$^{-3}$, and n-Al$_{0.65}$Ga$_{0.35}$N and Al$_{0.65}$Ga$_{0.35}$N beyond $1 \times 10^{20}$ cm$^{-3}$ electron concentration. The structure in FIG. 2 serves as a test structure used for Hall and CV measurements.

Hall effect measurements determine electron density and mobility in AlGaN. These measurements are conducted at room temperature to evaluate electrical resistivity for application to electronic and optoelectronic devices. Temperature variable Hall measurements provide electron density as a function of temperature from room temperature down to 10 Kelvin to evaluate impurity ionization energy. When electron densities beyond $1 \times 10^{20}$ cm$^{-3}$ are measured at room temperature, the density is beyond the degeneracy minimum limit for the conduction band of AlGaN. Temperature variable Hall measurements confirm that there is no change in electron density with temperature, which indicates that doping concentration beyond the degeneracy limit has been achieved.

The invention avoids the problem of self-compensation of dopants where a limit in electrical activity is reached with increasing dopant concentration. In self-compensation of n-type materials, donor impurities will reach a limit of incorporation onto donor sites, and begin to incorporate on acceptor, or other deep level sites. Self-compensation is avoided when most of the impurities are located at donor sites in the crystal. This condition occurs most readily for crystals that have high degrees of perfection, and low levels of unwanted impurities. The invention of this technique to reach degenerate doping concentrations in AlGaN is the result of reducing mechanisms for premature onset of compensation of donor impurities, such as those frequently encountered in the growth of AlGaAs on GaAs substrates.

Figure 3:
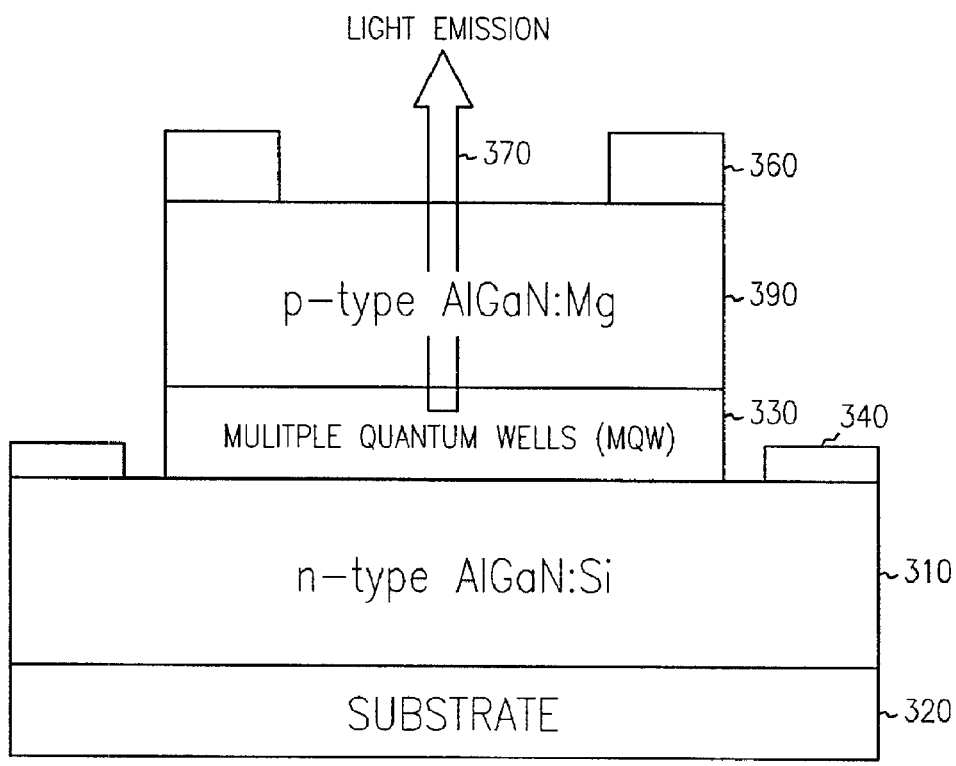
FIG. 3 is a cross section representation of a light emitting diode formed with layers of highly doped AlGaN.

FIG. 3 is a cross section representation of a light emitting diode formed with various layers of highly doped AlGaN. N-type AlGaN:Si is formed as a layer 310 on top of a substrate 320. Light emitting structures 330, referred to as multiple quantum wells (MQW) are formed on top of the n-type AlGaN:Si. MQWs are well known as structures used in light emitting or laser diodes consisting of stacks of p-type and n-type wide band gap materials surrounding the MQWs. N-type ohmic contacts 340 are also formed on top of the n-type AlGaN:Si layer 310 outside of the MQWs.

A p-type AlGaN:Mg layer 350 is then formed on top of the MQW layer 330 in a manner virtually identical to the formation of the n-type AlGaN:Si layer 310, with Si being replaced by Mg, Be, C or Li to form acceptors. The p-type AlGaN:Mg is also highly doped and therefore highly conductive. In one embodiment, the low oxygen growth techniques developed for the n-type doping are applied to similarly raise the p-type doping efficiency.

An alternative to using a single acceptor species is to co-dope the acceptor atoms with donor atoms such as Si. In this embodiment, hole densities beyond the co-doped donor density are obtained. The high donor density of the invention can be applied to establish a higher hole density in p-type AlGaN. P-type ohmic contacts 360 are formed on top of the p-type AlGaN:Mg layer 350. In response to a voltage applied across the ohmic contacts 340 and 360, light is emitted from the multiple quantum wells 330 in a direction consistent with an arrow 370. Arrow 370 extends from the multiple quantum wells 330 through the p-type AlGaN:Mg, which is essentially transparent to such light.

The mole fraction of Al determines the bandgap energy (and wavelength of emission) of AlGaN. High Al mole fractions produce a large bandgap—GaN is 3.4 eV (364 nm) and AlN is 6.2 eV (200 nm). The LED or laser requires higher bandgap materials to surround the emitting materials to avoid self-absorption of light, and for the laser, to provide lower refractive index clad layers. Thus, to get shorter wavelength light, higher Al mole fractions are required, and even higher Al mole fractions need to be electrically conducting for the surrounding clad layers. The invention allows shorter TV wavelength light than could be emitted through present electrically conducting compositions.

Figure 4:
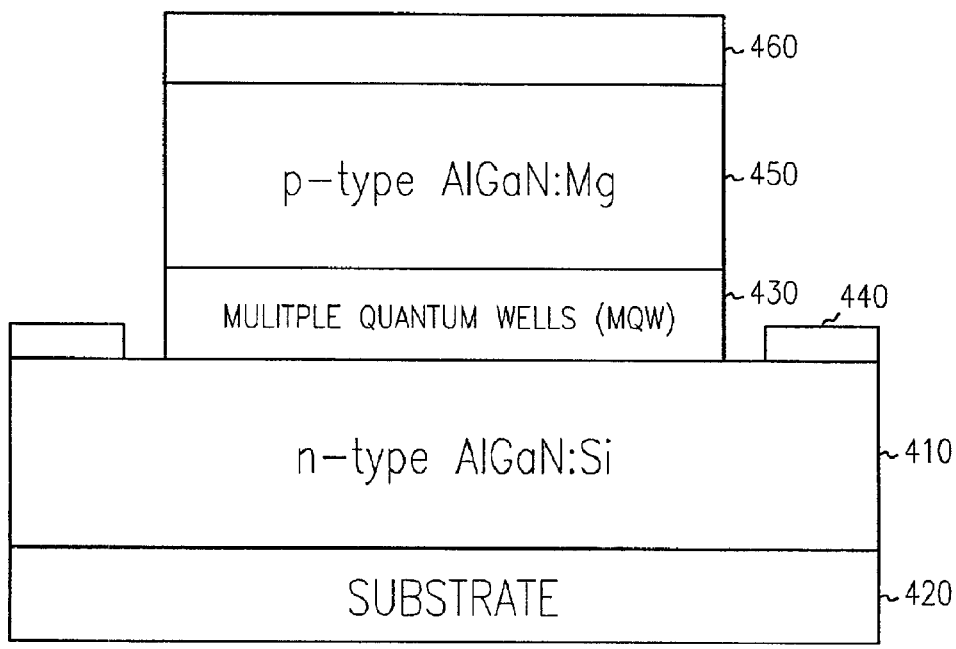
FIG. 4 is a cross section representation of a laser formed using highly doped AlGaN.

A laser embodiment using the highly doped AlGaN materials is shown in FIG. 4. N-type AlGaN:Si is formed as a layer 410 on top of a substrate 420. Multiple quantum wells 430 are formed on top of the n-type AlGaN:Si layer 410. N-type ohmic contacts 440 are also formed on top of the n-type AlGaN: Si layer 410 outside of the MQWs.

Figure 5:
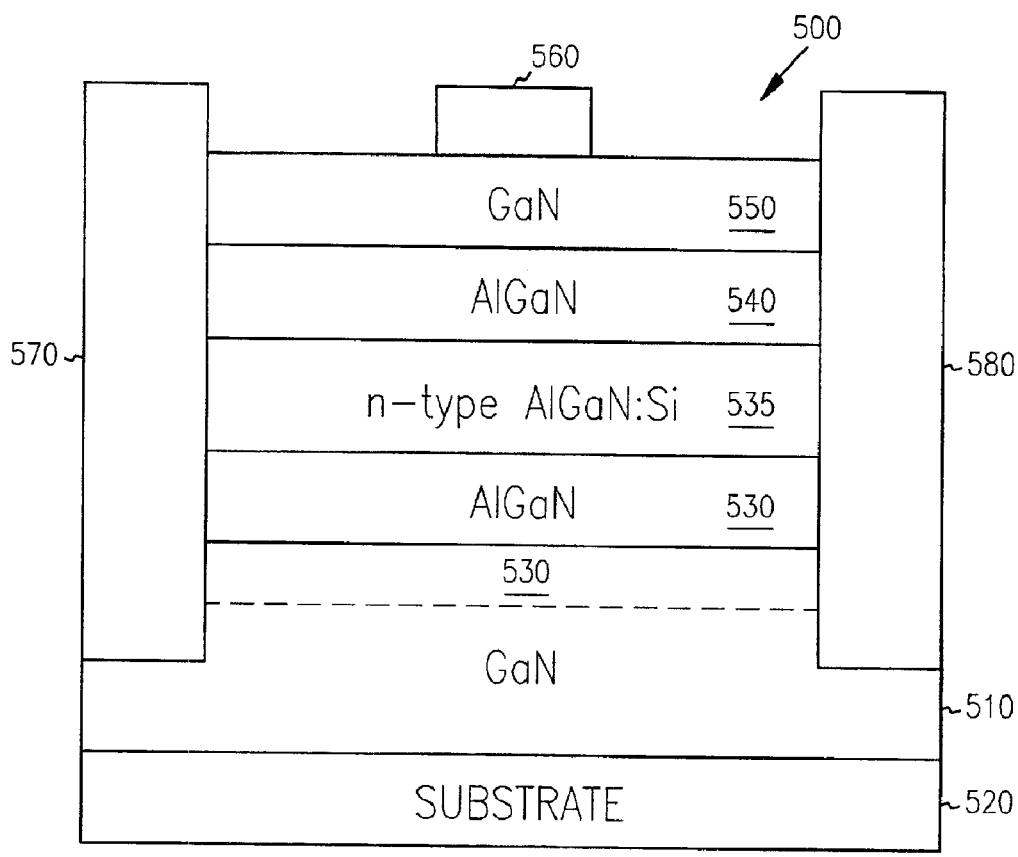
FIG. 5 is a cross section representation of a transistor formed using highly doped AlGaN.

A p-type AlGaN:Mg layer 450 is then formed on top of the MQW layer 430 in a manner virtually identical to the formation of the n-type AlGaN:Si layer 410, with Si being replaced by Mg to form acceptors. The p-type AlGaN:Mg is also highly doped and therefore highly conductive. P-type ohmic contacts 460 are formed on top of the p-type AlGaN:Mg layer 450. In this embodiment, the p-type ohmic contacts 460 completely cover the p-type AlGaN:Mg layer. In response to a voltage applied across the ohmic contacts 440 and 460, light is emitted from the multiple quantum wells 430 in a direction perpendicular to a line drawn between the two highly doped layers 450 and 410. Light emission is thus essentially coming out of the sheet containing FIG. 4. Light in the laser is confined by higher Al mole fraction cladding layers. The p-contact and conducting p-regions need to be very low resistance for the laser. For the LED, the p-type contact is in the way of emitted light, thus it needs to be small compared to the light emitting area. In this case, the p-type conductivity is also very important because the distance from the p-contact to the emitting region increases, and conductivity must take place through the poorly conducting p-type material (hole mobility is much lower than electron mobility, and resistivity is proportional to 1/neu where n is density, e is electron charge and u is mobility. The highly doped AlGaN layers are also useful in forming transistors. An example of one such transistor is shown in FIG. 5 at 500. A GaN layer 510 is formed on a substrate 520 such as a sapphire substrate. A two dimensional electron gas (2DEG) GaN layer is deposited via molecular beam epitaxy from plasma 525. A layer of AlGaN 530 is then formed on the gas layer 525. A highly doped n-type AlGaN:Si layer 535 is then formed in a manner consistent with the process of FIG. 1, followed by another layer of AlGaN 540 and a GaN layer 550. A Schottkey gate contact 560 is formed on top of the GaN layer 550, and a source ohmic contact 570 is formed adjacent a first side of the structure with drain ohmic contact 580 formed opposite the structure. The ohmic contacts 570 and 580 contact part of GaN layer 510, and all of the layers formed above the GaN layer 510 in one embodiment. The highly doped AlGaN permits higher sheet density in the 2DEG, thus higher transistor channel current.

Figure 6:
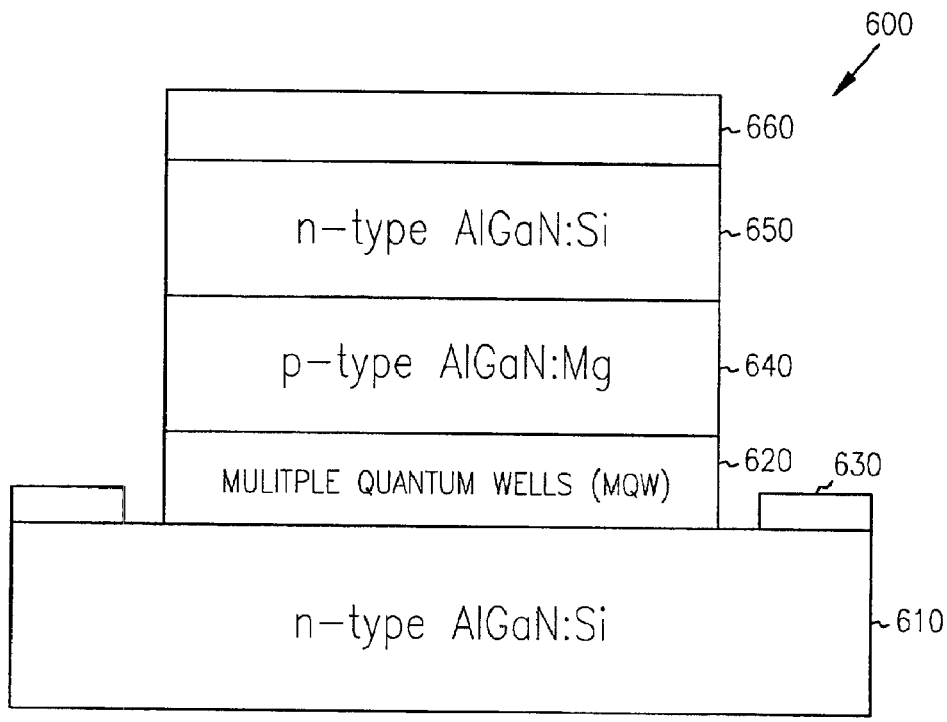
FIG. 6 is a cross section representation of a light emitting diode formed with a highly doped p-type runnel junction.

In FIG. 6, a structure providing a tunnel junction contact to p-type AlGaN is shown at 600. Multiple high-doped layers are utilized in structure 600. A first n-type AlGaN:Si layer is formed at 610, and has an MQW layer 620 and n-type ohmic contacts 630 formed thereon, somewhat adjacent to each other. A p-type AlGaN:Mg layer 640 is then formed on top of the MQW layer 620, followed by a n-type AlGaN:Si layer. Finally, another n-type ohmic contact 660 is formed on top of the n-type AlGaN:Si layer 650. The tunnel junction replaces the p-type ohmic contact in light emitters and LEDs. The highly conducting n-AlGaN provides a lower resistivity alternative to p-type AlGaN. This permits smaller metal contact layers that block less light from LEDs that emit through the top contact layers. For lasers, the tunnel junction provides lower laser series resistances, and more uniform current injection.

MBE Chamber

Figure 7:
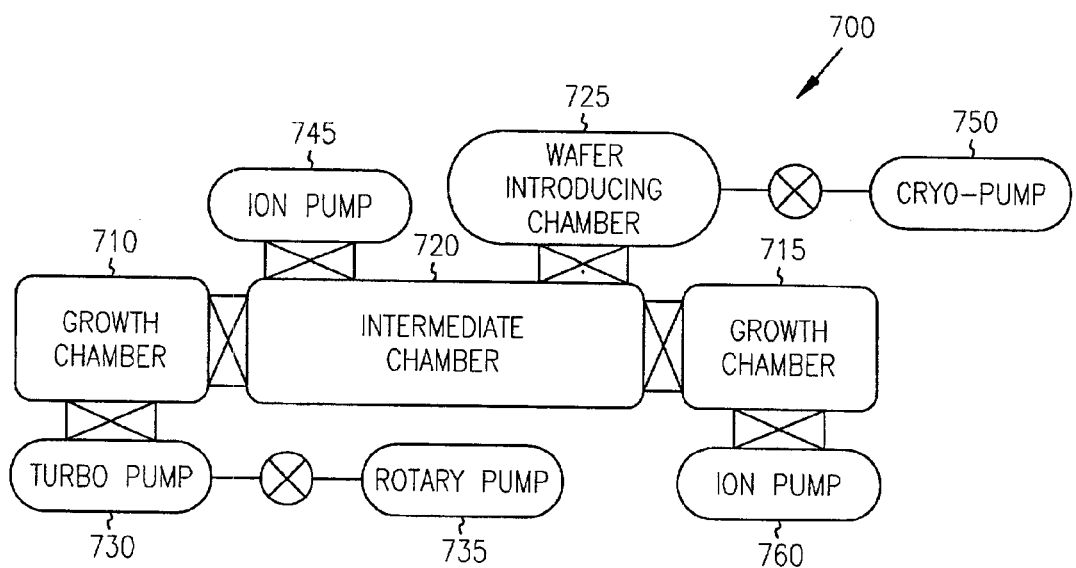
FIG. 7 is a block representation of a molecular beam epitaxy machine treated to minimize contamination of substrate work pieces.
Figure 8:
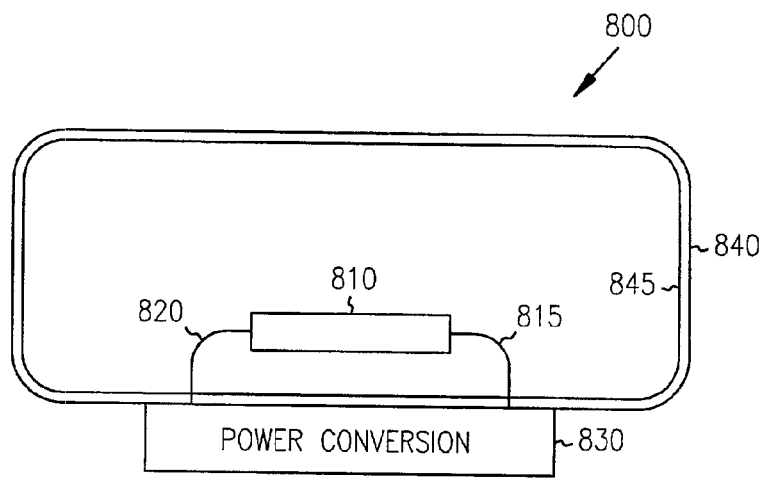
FIG. 8 is a block diagram of use of the light emitting diode of FIG. 3 as a UV source for a fluorescent light bulb.

A MBE apparatus conditioned to minimize contaminants is illustrated at 700 in FIG. 7. In one embodiment, it has three ultra-high vacuum chambers, two growth chambers 710 and 715 and an intermediate chamber 720. Intermediate chamber 720 placed between the two growth chambers 710 and 715 to connect them to each other. A wafer-introducing chamber is coupled to the intermediate chamber 720. A wafer (i.e., a substrate), on which semiconductor lasers are to be fabricated, is introduced into the MBE apparatus via the wafer introducing chamber, and then transferred inside the MBE apparatus from one chamber to the other.

To obtain high vacuum levels in selected chambers, a turbo-molecular pump 730 (simply indicated as the "turbo pump" in the figure) is coupled to growth chamber 710. Further pumps are coupled to other chambers as desired. The turbo pump 730 is capable of evacuating the growth chamber 710 to an ultra-high degree of vacuum. A rotary pump 735 coupled to the turbo pump 730 is also utilized.

Ion pumps 745 and 760 are coupled to intermediate chamber 720 and growth chamber 715 respectively. A cryopump 750 is coupled to respective chambers and is used to establish ultra high vacuum in the intermediate chambers. Furnaces also contain resistively heated pyrolytic boron nitride crucibles which contain Al, Ga and Si.

In one embodiment, a wafer (i.e., a substrate), on which semiconductor light emitting diodes are to be fabricated, is introduced into the MBE apparatus 700 via the wafer introducing chamber 725, and then transferred inside the MBE apparatus from one chamber to the other. Further chambers also have evacuation equipment for creating ultra-high vacuum conditions in selected chambers.

MBE Chamber maintenance is performed using standard, and customized ultra-high vacuum (UHV) techniques. When the MBE machine requires recharge of materials, or repair of broken items, it is brought to atmospheric pressure using nitrogen gas. All parts are handled with gloves to avoid contamination. The Al, Ga and In furnaces have crucibles installed for outgassing. Old crucibles are etched in Aqua-Regia (HCl and Nitric acid), rinsed in DI water and heated to dry. These recycled crucibles are used for Ga and In. Only new crucibles are used in the Al furnace because their use avoids a problem of Al creeping up the inside of the crucible and running out of the top, which ruins a furnace. Si is not routinely replaced. The same source has been employed for more than 10 years in one embodiment, however, it is anticipated that such a long period may not be required, and that other methods of reducing impurities in an Si furnace may be used The long period of operation at high temperatures contributes to very high purity operation of the Si furnace. Other undesirable impurities which may have been part of the original Si charge material have been reduced in concentration by prolonged high temperature furnace operation. Unwanted impurities are to be avoided to prevent undesired compensation of Si donors in AlGaN.

These crucibles are slowly individually raised in temperature and baked at 1500° C. for 1 hour. They are removed a day later and filled with Ga, In and Al. The machine is pumped down to UHV and checked for leaks. The machine is then surrounded by heater panels to form an oven and it is baked at temperatures near approximately 150° C. as measured by a thermocouple inserted inside the bake panels for 3–4 days.

In one embodiment, the substrate heater is raised in temperature to 1000° C. over 10 hours during the bake procedure. It is left at this temperature for 2 days until the bake is finished. This step provides out gassing of the substrate heater to remove impurities prior to utilization for AlGaN growth following the bakeout. If this step is not performed, there will be significant out gassing of impurities during AlGaN growth from the substrate heater. The out gassing of impurities during AlGaN growth will contaminate the AlGaN layer with oxygen, and possibly carbon or other materials which are known to produce undesired physical properties in most semiconductor crystals, and are often responsible for limiting electrical conductivity, and optical recombination efficiency. Secondary ion mass spectroscopy measurements (SIMS) of GaN grown in this machine show that oxygen levels are exceptionally low. These measurements show that this machine can reproducibly grow GaN with oxygen and carbon concentrations less than the detection limit of $5 \times 10^{16}$ cm$^{-3}$. These levels are lower than any published GaN data.

To insure that this data is reliable, in one example, a growth of GaN in this machine was performed on top of GaN grown elsewhere. The SINMs measurement clearly shows that GaN material from this machine has undetectable oxygen and carbon, while the other GaN underneath shows the higher, measurable levels typical of the best reports in the literature.

Heating the substrate heater during the bakeout removes these impurities more effectively than trying to accomplish the same end result when the machine is not being baked. Removing the impurities while the machine walls are hot will aid in keeping the impurities from sticking to the walls where they will then slowly outgas during growths. This procedure is probably not followed elsewhere because it carries a significant risk of heater failure for such a prolonged operation when all of the interconnecting leads are also at elevated temperature. A poor electrical connection which momentarily interrupts heater current under these conditions will usually destroy the expensive heater.

In a further embodiment, a light emitting diode such as that shown in FIG. 3 is utilized as a UV emitter for a fluorescent light bulb shown generally at 800. The light emitting diode is shown packaged in a transparent material for protection at 810. The transparent material is also coated with a fluorescing material 845 on the inside, such as phosphor to provide visible light. The light emitting diode 810 is supported by leads 815 and 820 which are coupled to a power conversion circuit 830 for converting high voltage supplies, such as household current into the low voltage utilized by the light emitting diode 810. The voltage is above the bandgap voltage, such as above 4 volts in one embodiment. 10 volts should be sufficient. Power conversion circuit 830 comprises a battery, such as a 9 volt battery commonly available in a further embodiment.

A case, such as glass, or a polymer is shown at 840, providing support for the elements of the light bulb, and also providing further protection is shown. It is filled with an inert gas in one embodiment to reduce oxidation of parts. The gas is not required, but if used, helps prevent degradation of the fluorescing material 845. Gases such as nitrogen, argon, or even a vacuum may be used. In one embodiment, the gas is selected to also be non-absorbing with respect to UV light. The case 840 may also take on characteristics of common light bulbs such as clear versus frosted, and may be any shape desired for decorative purposes.

Figure 9:
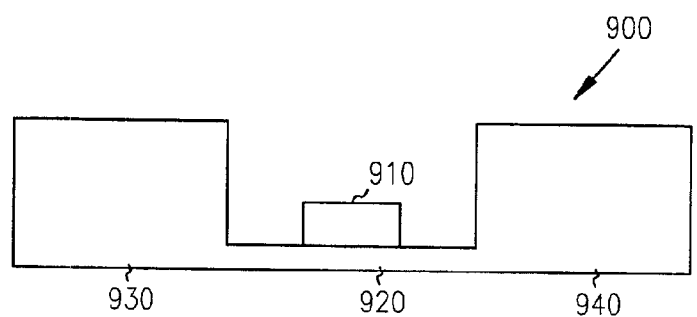
FIG. 9 is a block diagram of use of the light emitting diode of FIG. 3 as a purification element for a water filter.

In a further embodiment, a water purification system is shown at 900 in FIG. 9. A UV light emitting diode 910 such as that shown in FIG. 3 is utilized as a water purification element. It emits light at about 280 nm wavelengths to effectively kill biological materials such as bacterial in water flowing through a channel 920 between two reservoirs 930 and 940. Not shown, but implicit are pumping mechanisms and inlets and outlets in the reservoirs. Multiple channels with multiple light emitting diodes are utilized in one embodiment to maximize throughput.

Figure 10:
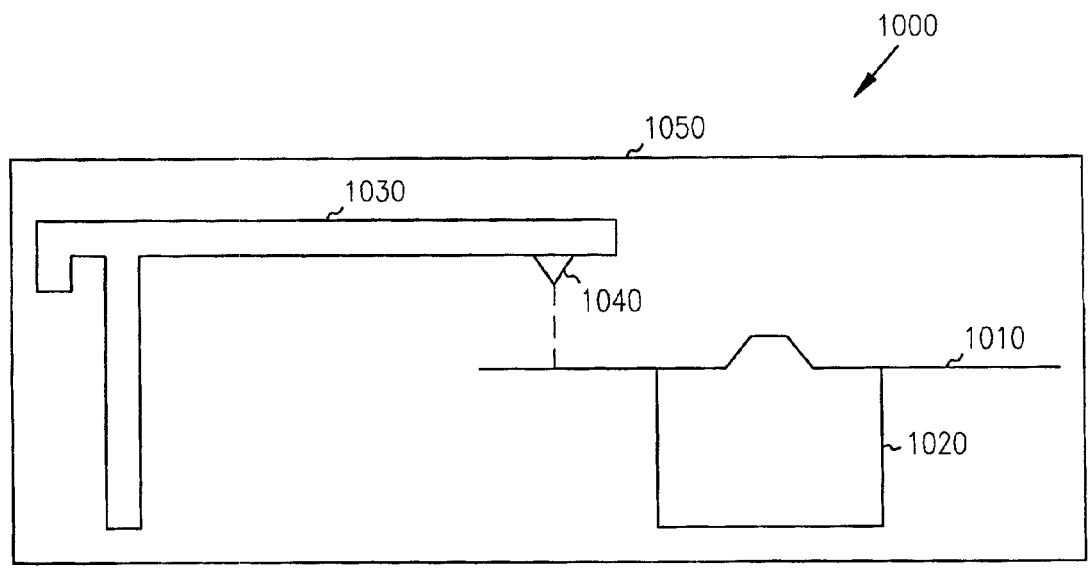
FIG. 10 is a block diagram of use of the laser of FIG. 4 as a transducer element in an optical digital storage device.

A laser such as that shown in FIG. 4 is used as a transducer element in an optical storage device 1000 in FIG. 10. A optical media 1010 is rotated by motor 1020 in one embodiment. A linear actuator 1030 is used to radially move a laser 1040 formed with the transducer element to follow tracks on the optical media 1010. Information is written onto and read from the tracks using the laser. A housing 1050 provides protection and support for components of the storage device 1000.

Figure 11:
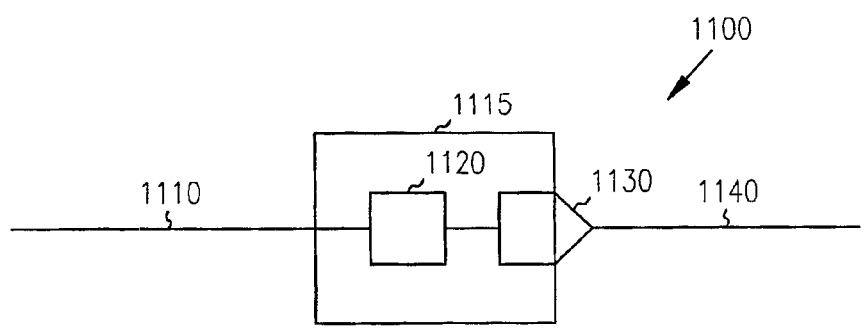
FIG. 11 is a block diagram of use of the laser of FIG. 4 as a transducer element for an optical telecommunications system.

In a further embodiment, a laser such as that shown in FIG. 4 is used as a transducer element in a telecommunications system 1100 as shown in FIG. 11. An electrical input signal 1110 is received by a transducer 1115. The transducer 1115 contains circuitry 1120 that receives the input signal and converts it to a signal compatible with driving the laser 1130, which is optically coupled to a fiber optic line 1140. In this manner, electrical signals are converted to optical signals for further transmission.

Figure 12:
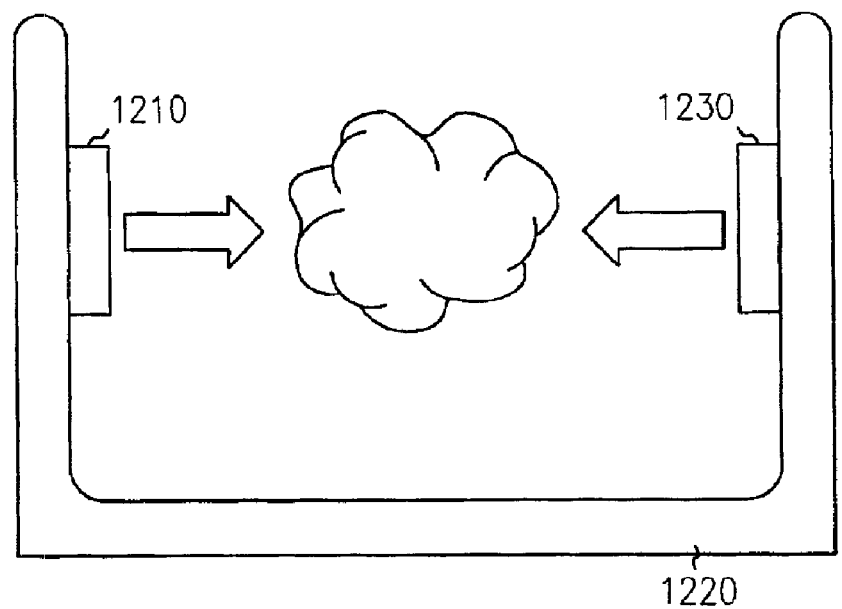
FIG. 12 is a block diagram of a biological detection system utilizing light emitting diodes.

In yet a further embodiment, a biological hazard detection system is shown in FIG. 12. The detection system has a light emitting diode 1210 emitting light with a wavelength of approximately 280 nm that is used to detect biological hazards. The light emitting diode 1210 is positioned on one side of a support structure 1220, with a photodetector 1230 also positioned on the support structure 1220 or some other structure. The light emitting diode 1210 emits light toward the photodetector. The support structure 1220 allows suspected biological materials to pass between the light emitting diode 1210 and the photodetector 1230. In one embodiment, the biological materials fluoresce in response to light of that wavelength. The fluorescence is detected by the photodetector 1230 and is indicative of the presence of the biological material. Both the amplitude of the fluorescence, and the frequency of the fluorescence may be utilized by appropriate circuitry to identify the biological hazard.

Figure 13:
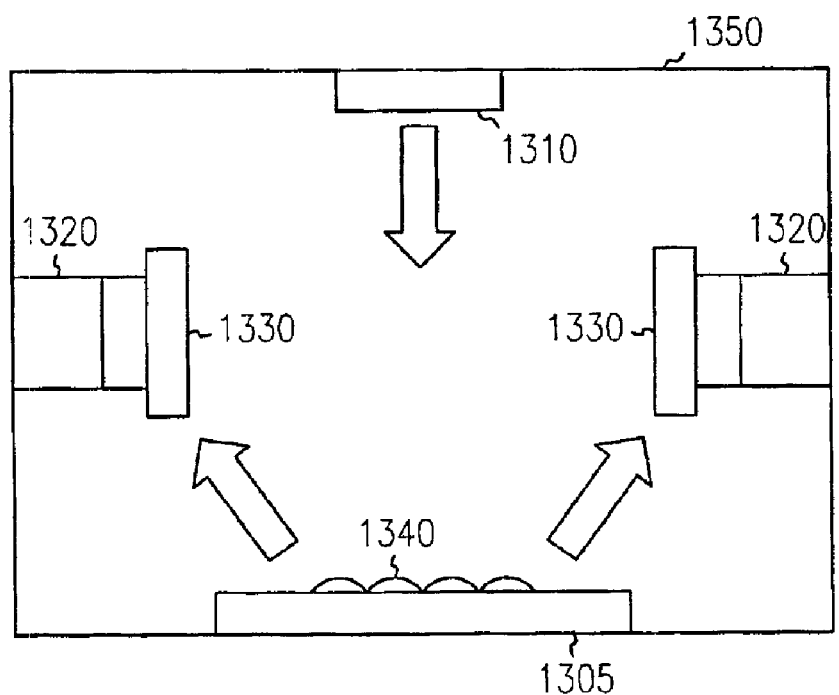
FIG. 13 is a block diagram of a further biological detection system utilizing light emitting diodes.

In an alternative biological hazard detecting system shown in FIG. 13, a fluorescing material 1305 is placed proximate a light emitting diode 1310 and one or more photodetectors 1320. Photodetectors 1320 optionally have a bandpass filter 1330 disposed between the photodetectors and the fluorescing material 1305. Biological materials 1340 accumulate on the fluorescing material 1305, causing it to fluoresce in the presence of light from the light emitting diode 1310. The photodetector 1320 operates as above to provide at least one of intensity and frequency to circuitry to identify the presence or concentration of the biological material, or to identify the material itself. The elements are supported by a suitable support structure 1350 allowing biological materials to accumulate on the fluorescing material 1305.

In further embodiments, lasers constructed in accordance with the invention in combination with photodetectors are utilized to detect clouds of biologically hazardous materials from a distance. The location of the photodetectors may be any place desired where fluorescing of the biological materials can be observed. In one embodiment, both the laser and photodetector are on a plane or the ground or other ground vehicle or structure. In a further embodiment one is on a plane and the other on the ground, or a different plane such as a drone.

CONCLUSION

A technique for obtaining high carrier densities in wide bandgap semiconductors is described. Dopant impurities in wide bandgap semiconductors (Eg>4 eV typical) exhibit large ionization energies compared to those encountered in smaller bandgap semiconductors. Large ionization energies result in small fractions of impurities which are ionized at operating temperatures near room temperature (approximately 296°K). The ionization energy barrier is effectively removed, enabling ionization of most of the dopants. This results from employing what is termed heavy doping density (HDD).

Electrical conductivity in semiconductors is increased by the addition of dopants to add electrical charge. Impurities which add (or donate) mobile electrons are called donors. Impurities which remove (or accept) electrons are called acceptors. Acceptors are said to create mobile holes which have positive charge that conduct electricity, similar to mobile electrons. These mobile charges require sufficient energy to remove them from their host impurity. This energy is called the ionizaton, or activiation energy. The density of carriers which result from ionization of impurities is:

$$n = N_d \exp(-E_a/kT)$$

where, n=density of electrons (cm−3)
Nd=density of donor impurities (cm−3)
Ea=activation energy (eV)
K=Boltzman constant (eV/K)
T=temperature (K)

Activation energy is related to effective mass and relative dielectric constant, which are related to bandgap. Dopants in larger bandgap semiconductors typically have larger activation energy as shown in the following equation:

$$E_a = 13.6*(m*/m_0)/(\epsilon_r/\epsilon_0)^2)$$

In variable composition material such as AlGaN, activation energy for donors is approximately 30 meV for GaN and 350 meV for AlN. As a result of high activation energy, very few carriers result from impurity ionization when compositions of AlGaN close to AlN are made. The density of ionized impurities is normally too low to add significant electrical conductivity to this material.

These formulations for ionization energy no longer apply when large impurity densities (approaching 1% of the volume of the semiconductor crystal) are utilized. A new behavior for ionization of dopants takes place. This new behavior appears to take place when the dopant atoms occupy the atomic sites required for their donor or acceptor behavior. In one embodiment, Si doping atoms are added as donors to AlGaN. When these very large impurity densities, on the correct crystal lattice site, are successfully achieved, the orbits of valence electrons of donor atoms begin to overlap with one another. The ionization energies of the donor atoms are altered by the presence of the other nearby donor atoms. The result is that the energy barriers fall away to negligible values. Proof of the lack of significant energy barrier is the temperature variable Hall effect measurement of electron density as a function of temperature. No significant loss of carrier density is experienced as temperature is lowered from 300 K to 20 K. This behavior is in contrast to the commonly utilized semiconductor doping densities where valence orbits interact only with the host semiconductor, which gives rise to the more typical thermal ionization barriers.

The ionization energy changes under heavy doping density (HDD) from a narrowly defined thermal ionization energy to a band of energy, where, for example, the donor band overlaps the conduction band in n-type material. This conduction occurs when the degeneracy of the band is exceeded—more carriers are available than required to fill the lower energy portion of the conduction band. The material is also described as being degenerate under controlled incorporation of heavy doping densities of impurities. In one embodiment described above, Si doping AlGaN at compositions up to 65% Al mole fraction, with electron densities up to $1 \times 10^{20}$ cm$^{-3}$ is obtained. This behavior can be obtained in other wide bandgap semiconductor systems, when sufficient control of the dopant atom placement within the crystal lattice is achieved. Recent results using the above techniques for doping AlGaN provide electron densities approaching $1 \times 10^{20}$ cm$^{-3}$ in Al compositions of 78–79%, demonstrating that the process is applicable to other wide bandgap materials.

The method of overcoming ionization limits to carrier densities is applicable throughout wide bandgap semiconductors where ionization energies severely limit conductivity. Some of such semiconductors include:

AlN
BN
Diamond
Other diamond-like semiconductors such as carbon nitride, or carbon-based nanotubes
Diamond-like nitrides
Other carbon-based semiconductor-like materials such as fullerenes (bucky-balls).
Other doped glasses, oxides and ceramics The techniques described for heavily doping AlGaN may be used on these wide bandgap materials, and others. However, actual ranges of growth conditions will likely vary for different materials. In any event, determining such ranges will likely simply be a matter of trial and error, starting with the ranges used for AlGaN.

Further potential applications extend beyond obtaining higher electrical conductivity for conducting current, to other physical properties which depend on mobile carriers and ionized impurities. Added electron density alters index of refraction. The selective introduction of heavy doping density with location could be used as the basis for guiding light in optoelectronic components and systems through control of refractive index.

Overcoming thermal ionization energies with the invented technique could also be applied to quantum wells, quantum wires, quantum dots and quantum dots made from wide bandgap materials for application to light emitters, transistors, light detectors and solar cells. Photovoltaic cells which convert photons, or atomic particles, at energies far above visible light will require electrical conductivity for extracting electrons generated by photon or particle absorption. Suitable materials will possess very large bandgaps (10's to 100's of eV) and will require heavy doping density to overcome thermal ionization limits to electrical conductivity.

While the concept of heavy doping density to overcome thermal ionization has been demonstrated for donors, it applies equally to ionization of acceptor impurities. The key element is achieving sufficient acceptor densities on electrically active lattice sites. Because hole effective mass is larger than effective mass in most semiconductor structures, the doping density required to overcome ionization limits is higher. In practice it becomes more difficult to dope wide bandgap materials p-type than n-type (e.g.—GaN and AlGaN). The invented method of eliminating thermal ionization barriers through heavy doping density provides a technique to obtaining high conductivity p-type materials as well as n-type materials.

In one embodiment, a method of forming a highly doped layer of AlGaN, is practiced by first removing contaminants from a MBE machine. Wafers are then out gassed in the machine at very low pressures. A nitride is then formed on the wafer and an AlN layer is grown by opening Al and RF shutters. The highly doped AlGaN layer is formed by opening RF, Al, Ga and dopant shutters. Degenerate doping concentrations are obtained which eliminate barriers to impurity ionization.

Injection of holes into AlGaN through $n^+/p^+$ tunnel junctions is used to replace thick p-AlGaN with n-AlGaN as a contact to multiple quantum well (MQW) emitters. High doping concentration provided by the current invention further reduces AlGaN resistance, and reduces the already small parasitic voltage drop and series resistance introduced by the tunnel junction. In one embodiment, n-GaN beyond $3 \times 10^{20}$ cm$^{-3}$, and n-Al$_{0.65}$Ga$_{0.}$ beyond $1 \times 10^{20}$ cm$^{-3}$ electron concentrations are obtained. Electron densities in AlGaN with Al mole fractions up to 65% are more than $1 \times 10^{20}$ cm$^{-3}$ where previous reports only showed doping in the $10^{17}$–$10^{18}$ cm$^{-3}$ range at compositions of 45% and 30% respectively. No previous techniques have shown electrical conductivity usable for Al compositions above 50%. The invented technique thus has improved electrical conductivity by 100–1000 times, or much more, depending on specific Al mole fraction. This improvement reduces parasitic voltage loss to levels where high efficiency light emitting diodes, including lasers, can be made.

These levels of doping at high Al mole fraction provide application of n-type bulk, and n/p tunnel injection to short wavelength UV emitters with very high wall-plug efficiency. Ohmic contact resistance to MQWs is greatly reduced with such doping levels. Such doping levels provide ohmic contacts to undoped Al$_{0.65}$Ga$_{0.35}$N.

Further embodiments include light emitting diodes having wavelengths between approximately 254 and 290 nm for use in fluorescent light bulbs, photonic transmssion and detection, biological, explosive and toxic material detection, water purification and other decontamination environments. Lasers formed using the highly doped layers are useful in high-density storage applications or telecommunications applications. In yet a further embodiment, a transistor is formed utilizing the highly doped layer as a channel.

In a further embodiment, a molecular beam epitaxy (MBE) machine is specially maintained and utilized to provide an environment where nitrides are grown free of detectable levels of oxygen for highly efficient doping of materials, such as AlGaN. In one embodiment, nitrogen gas is used to bring MBE chambers to atmospheric pressure for repairs. Crucibles for materials are baked, as is the entire MBE. In a further embodiment, a substrate heater of the MBE is raised in temperature during the bake. Up to 1000° C. for 10 hours is utilized in one embodiment prior to AlGaN growth.

After treating the MBE machine, a wafer is loaded into a growth chamber of the MBE machine at low pressure, where the wafer is nitridized at high temperatures and RF exposure. AlN is then deposited at high temperatures and RF, followed by exposure to Al, Ga and Si with an RF shutter open at temperatures exceeding approximately 1100° C. The temperature of the Si is adjusted to obtain different doping densities. The temperature of the Al also controls the mole fraction of the Al, with higher temperatures leading to a higher Al mole fraction.

While the invention was described in terms of doping using an MBE machine, other processes may also be employed. In one embodiment, undesirable contaminants are also minimized in the other processes.

What is claimed is:

1. A method comprising:

removing contaminants from a MBE machine;

outgassing a wafer in the MBE machine at low pressure to remove atmosphere contamination;

forming a layer of AlGaN on the wafer, having a mole fraction of Al of at least approximately 0.47; and doping the layer of AlGaN beyond degeneracy.

2. The method of claim 1 wherein forming a layer of AlGaN comprises using an Al crucible temperature of at least approximately 1225° C.

3. The method of claim 2 wherein forming a layer of AlGaN comprises flowing nitrogen by an RF source.

4. The method of claim 1 wherein doping the layer comprises maintaining an Si temperature of approximately 1425° C. in a crucible in the MBE machine.

5. The method of claim 1 wherein removing contaminants from an MBE machine comprises:

outgassing material crucibles prior to use in fabricating devices;

establishing ultrahigh vacuum within MBE chambers;

bringing the MBE chambers to atmospheric pressure using nitrogen for maintenance and replenishing materials in crucibles; and operating the MBE for long periods of time at high temperatures.

6. The method of claim 5 wherein crucibles are baked at 1500° C. for approximately one hour, and then cooled and filled with Ga and Al prior to forming the AlGaN layer.

7. The method of claim 1, wherein orbits of valence electrons of donor atoms in the layer overlap with one another.

8. The method of claim 1 wherein the layer is doped with impurities, and wherein the impurities comprise at least approximately 1% of the volume of the semiconductor material.

9. The method of claim 8 wherein dopant atoms occupy atomic sites required for donor or acceptor behavior in the doped layer.

10. The method of claim 8 wherein the dopant comprises Si, Be, Mg, Ca, Zn, Sr, or Cd.

* * * * *